United States Patent
Pavate et al.

(10) Patent No.: US 6,432,819 B1
(45) Date of Patent: Aug. 13, 2002

(54) METHOD AND APPARATUS OF FORMING A SPUTTERED DOPED SEED LAYER

(75) Inventors: Vikram Pavate; Murali Narasimhan, both of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/406,325

(22) Filed: Sep. 27, 1999

(51) Int. Cl.$^7$ .......................... H01L 21/44; B05D 5/12; C23C 16/00
(52) U.S. Cl. ....................... 438/676; 438/687; 427/124; 427/571; 427/576; 118/723 R; 118/723 MR; 118/723 MA
(58) Field of Search ................... 438/676, 687

(56) References Cited

U.S. PATENT DOCUMENTS

| | | | |
|---|---|---|---|
| 4,159,909 A | 7/1979 | Wilson | 75/170 |
| 4,466,940 A | 8/1984 | Siewert et al. | 420/507 |
| 4,620,872 A | 11/1986 | Hijikata et al. | 75/246 |
| 4,808,373 A | 2/1989 | Hoffman et al. | 420/507 |

(List continued on next page.)

FOREIGN PATENT DOCUMENTS

| | | | |
|---|---|---|---|
| EP | 0 335 383 | 6/1994 | H01L/23/532 |
| EP | 0 601 509 | 6/1994 | H01L/23/485 |
| EP | 0 877 421 | 11/1998 | H01L/21/768 |
| JP | 03289156 | 12/1991 | H01L/21/90 |
| JP | 5-267299 | * 10/1993 | |
| JP | 09-199976 | 7/1997 | H03H/9/145 |
| JP | 11-214702 | 8/1999 | H01L/29/786 |
| WO | WO 97/47783 | 12/1997 | C23C/16/18 |

OTHER PUBLICATIONS

ASM Handbook, vol. 5, Surface Engineering, ASM International: Materials Park, OH, p. 175, 1994.*
Austrian Patent Office Search Report from SG 200101298–8, Dated Oct. 23, 2001.
Austrian Search Report from Singapore Application No. 200005556–6, Dated Jan. 28, 2002.

*Primary Examiner*—Olik Chaudhuri
*Assistant Examiner*—Erik Kielin
(74) *Attorney, Agent, or Firm*—Moser, Patterson & Sheridan LLP

(57) ABSTRACT

The present invention generally provides a method and apparatus for forming a doped layer on a substrate to improve uniformity of subsequent deposition thereover. Preferably, the layer is deposited by a sputtering process, such as physical vapor deposition (PVD) or Ionized Metal Plasma (IMP) PVD, using a doped target of conductive material. Preferably, the conductive material, such as copper, is alloyed with a dopant, such as phosphorus, boron, indium, tin, beryllium, or combinations thereof, to improve deposition uniformity of the doped layer over the substrate surface and to reduce oxidation of the conductive material. It is believed that the addition of a dopant, such as phosphorus, stabilizes the conductive material surface, such as a copper surface, and lessens the surface diffusivity of the conductive material. The overall surface diffusivity of copper is reduced such that the tendency to agglomerate or to become discontinuous is reduced, thereby allowing the deposition of a smoother conductive film and thereby reducing localized agglomeration of the conductive material. The smoother film is highly desirable for subsequent deposition processes. A conductive material, such as copper, can be deposited on the deposited doped layer by a variety of processes including PVD, chemical vapor deposition (CVD), electroplating, electroless deposition and other deposition processes.

1 Claim, 2 Drawing Sheets

U.S. PATENT DOCUMENTS

| | | | |
|---|---|---|---|
| 4,814,053 A | 3/1989 | Shimokawato | 204/192.15 |
| 4,885,029 A | 12/1989 | Buerkle et al. | 75/235 |
| 4,999,096 A | 3/1991 | Nihei et al. | 204/192.3 |
| 5,023,698 A * | 6/1991 | Kobayashi et al. | 357/67 |
| 5,039,570 A | 8/1991 | Sturm | 428/209 |
| 5,130,274 A | 7/1992 | Harper et al. | 437/195 |
| 5,330,629 A | 7/1994 | Cunningham et al. | 204/192.17 |
| 5,496,391 A | 3/1996 | Noel | 75/255 |
| 5,567,382 A | 10/1996 | Danelia | 419/19 |
| 5,599,740 A | 2/1997 | Jang et al. | 437/190 |
| 5,685,491 A | 11/1997 | Marks et al. | 239/533.12 |
| 5,686,335 A | 11/1997 | Wuu et al. | 437/48 |
| 5,693,565 A | 12/1997 | Camilletti et al. | 437/192 |
| 5,801,100 A | 9/1998 | Lee et al. | 438/678 |
| 5,803,342 A | 9/1998 | Kardokus | 228/173.2 |
| 5,809,393 A | 9/1998 | Dunlop et al. | 419/61 |
| 5,917,244 A | 6/1999 | Lee et al. | 257/762 |
| 5,943,584 A | 8/1999 | Shim et al. | 438/398 |
| 5,997,699 A | 12/1999 | Leiphart | 204/192.3 |
| 6,099,705 A * | 8/2000 | Chen et al. | 204/298.06 |
| 6,113,761 A * | 9/2000 | Kardokus et al. | 204/398.13 |
| 6,130,156 A * | 10/2000 | Havemann et al. | 438/637 |
| 6,165,567 A * | 12/2000 | Ventzek et al. | 427/576 |
| 6,181,012 B1 * | 1/2001 | Edelstein et al. | 257/762 |

* cited by examiner

METHOD AND APPARATUS OF FORMING A SPUTTERED DOPED SEED LAYER

BACKGROUND OF THE INVENTION

1. Field of the Invention

The present invention relates to the deposition of a layer on a substrate. More specifically, the invention relates to deposition of a doped layer on a substrate.

2. Background of the Related Art

Consistent and fairly predictable improvement in integrated circuit design and fabrication has been observed in the last decade. One key to successful improvements is multilevel interconnect technology, which provides the conductive paths between the devices of an integrated circuit (IC) and other electronic devices. The shrinking dimensions of features, presently in the sub-quarter micron and smaller range, such as horizontal interconnects (typically referred to as lines) and vertical interconnects (typically referred to as contacts or vias; contacts extend to a device on the underlying substrate, while vias extend to an underlying metal layer, such as M1, M2, etc.) in very large scale integration (VLSI) and ultra large scale integration (ULSI) technology, has increased the importance of reducing capacitive coupling between interconnect lines and reducing resistance in the conductive features.

Aluminum has traditionally been the choice of conductive materials used in metallization. However, smaller feature sizes have created a need for a conductive material with lower resistivity than aluminum. Copper is now being considered as an interconnect material to replace or complement aluminum because copper has a lower resistivity (1.7 $\mu\Omega$-cm compared to 3.1 $\mu\Omega$-cm for aluminum) and higher current carrying capacity.

Despite the desirability of using copper for semiconductor device fabrication, choices of methods for depositing copper into features having a high aspect ratio above about 4:1 in sub-quarter micron features are limited. In the past, chemical vapor deposition (CVD) and physical vapor deposition (PVD) were the preferred processes for depositing electrically conductive material, typically aluminum, to fill the contacts, vias, lines, or other features formed on the substrate. However, precursors for CVD processes for depositing copper are currently under development and PVD processes for filling copper features can bridge the openings of very small features and leave voids in the features.

As a result of CVD and PVD challenges, electroplating processes, previously used primarily for circuit board fabrication, are being developed for deposition of conductive material, particularly copper, to fill small features on a substrate. However, electroplating has its own challenges in depositing uniformly on a substrate. Electroplating uses an electrically conductive seed layer, such as a copper layer conformally deposited by CVD or PVD, to initiate the electroplating deposition process on the substrate. As stated, the CVD of copper is being developed and thus, PVD is the current choice for depositing the seed layer conformally over the feature.

However, PVD of copper tends to agglomerate across the deposition surface and in the lines and vias due to surface diffusion of the copper material. As the copper is deposited on a substrate, a high surface diffusivity of copper, which is a function of the deposition temperature, causes the deposited copper film to agglomerate such that the film will either dewet, thereby becoming discontinuous, and/or roughen such that the agglomeration reduces the overall surface energy of the exposed copper surface. This agglomeration has the adverse effect on a subsequent electroplating process such that either the discontinuous film will lead to micro-voids in the electroplated copper or the roughened surface will provide a localized electrical field, also resulting in micro-voids and other nonuniformities. If the electroplated layer, such as a seed layer, is nonuniformly deposited on the substrate, then the current will not be evenly distributed over the surface of the seed layer and may result in nonuniform deposition of a subsequent electroplated layer on the substrate.

Furthermore, copper is highly susceptible to oxidation, which increases the resistivity of a copper feature. Oxidation can occur when the substrate is moved between chambers and exposed to ambient conditions or in a particular process that exposes the copper to an oxygen source. Oxidation of copper increases the resistivity of the lines and vias formed.

Therefore, there is a need for an improved deposition process that reduces the voids in features produced from a conductive material deposition and reduces unwanted oxidation effects on the substrate.

SUMMARY OF THE INVENTION

The present invention generally provides a method and apparatus for forming a doped layer on a substrate to improve uniformity of subsequent deposition thereover. Preferably, the layer is deposited by a sputtering process, such as physical vapor deposition (PVD) or Ionized Metal Plasma (IMP) PVD, using a doped target of conductive material. Preferably, the conductive material, such as copper, is alloyed with a dopant, such as phosphorus, boron, indium, tin, beryllium, or combinations thereof, to improve deposition uniformity of the doped layer over the substrate surface and to reduce oxidation of the conductive material. It is believed that the addition of a dopant, such as phosphorus, stabilizes the conductive material surface, such as a copper surface, and lessens the surface diffusivity of the conductive material. The overall surface diffusivity of copper is reduced such that the tendency to agglomerate or to become discontinuous is reduced, thereby allowing the deposition of a smoother conductive film and thereby reducing localized agglomeration of the conductive material. The smoother film is highly desirable for subsequent deposition processes. A conductive material, such as copper, can be deposited on the deposited doped layer by a variety of processes including PVD, chemical vapor deposition (CVD), electroplating, electroless deposition and other deposition processes.

In one aspect, the present invention provides an apparatus for depositing a material on a substrate, comprising a processing chamber and a doped conductive target. The target comprises a conductive material selected from the group of copper, tungsten, aluminum or combinations thereof and a doping material selected from the group of phosphorus, boron, indium, tin, beryllium or combinations thereof.

In another aspect, the invention provides a doped conductive target for sputtering a layer on a substrate. The doped conductive target comprises a conductive material selected from the group of copper, tungsten, aluminum or combinations thereof and a doping material selected from the group of phosphorus, boron, indium, tin, beryllium or combinations thereof.

In another aspect, the invention provides a substrate having a doped seed layer deposited by a sputtering process on the substrate. The doped seed layer comprises a conductive material selected from the group of copper, tungsten, aluminum or combinations thereof and a doping material selected from the group of phosphorus, boron, indium, tin, beryllium or combinations thereof.

In another aspect, the invention provides a method of sputtering a layer on a substrate, comprising generating a plasma in a substrate processing chamber, sputtering material from a doped conductive target, the target comprising a conductive material selected from the group of copper, tungsten, aluminum or combinations thereof and a doping material selected from the group of phosphorus, boron, indium, tin, beryllium or combinations thereof, and depositing the sputtered doped material on the substrate. A conductive layer of copper can be deposited over the sputtered doped material, preferably, by an electroplating process.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method and apparatus for forming a doped layer on a substrate, preferably using a sputtering process. The doped layer preferably comprises copper doped with phosphorus.

Figure 1:
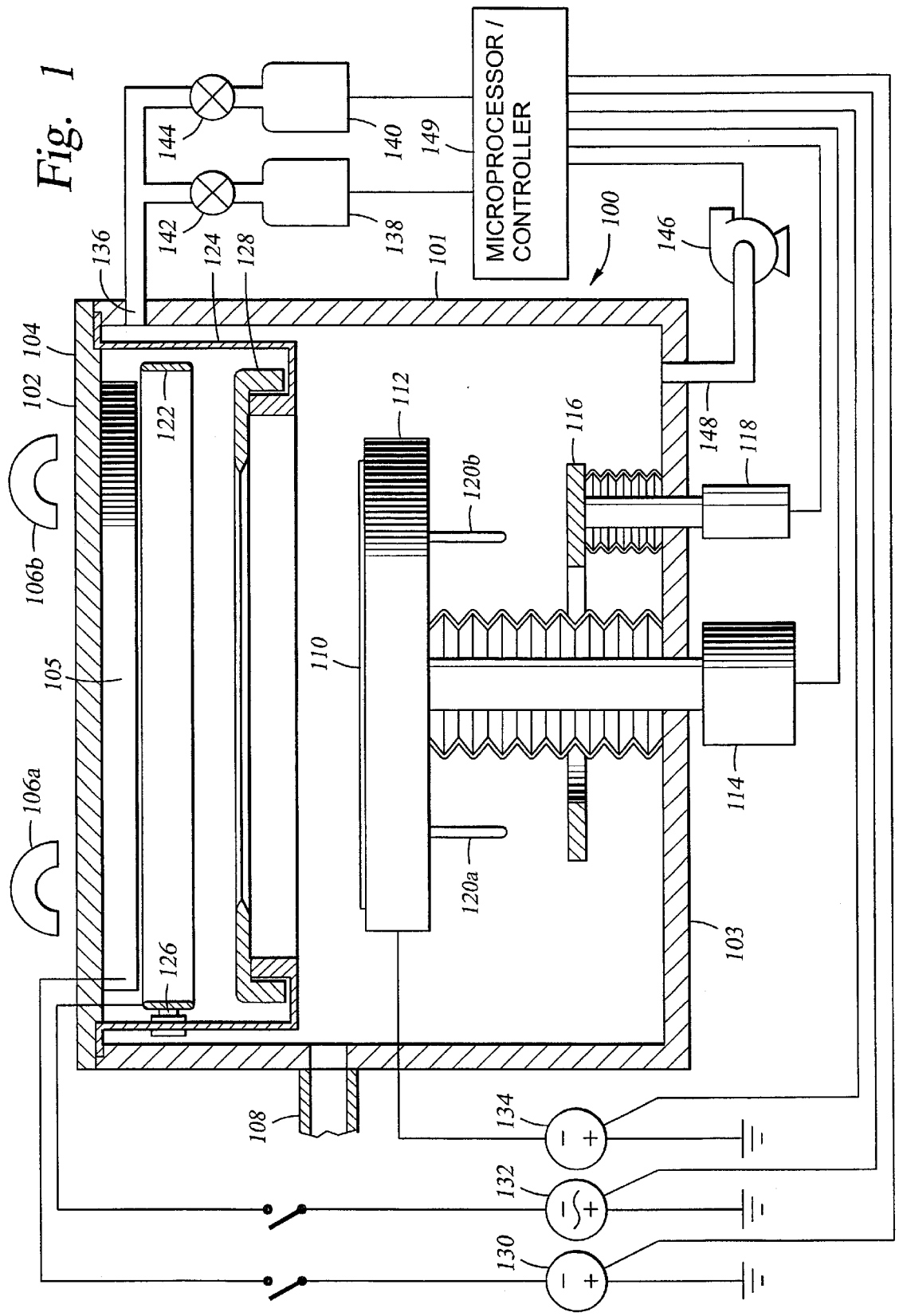
FIG. 1 is a schematic cross-sectional view of an IMP chamber.

FIG. 1 is a schematic cross-sectional view of an IMP chamber 100, capable of generating a relatively high density plasma, i.e., one with a capability to ionize a significant fraction of both the process gas (typically argon) and the sputtered target material. A sputtering chamber, known as an IMP Vectra™ chamber, is available from Applied Materials, Inc. of Santa Clara, Calif. The IMP chamber can be integrated into an Endura™ platform, also available from Applied Materials, Inc. The IMP process provides a higher density plasma than standard PVD that causes the sputtered target material to become ionized as the sputtered material passes therethrough. The ionization enables the sputtered material to be attracted in a substantially perpendicular direction to a biased substrate surface and to deposit a thin layer even in high aspect ratio features. The high density plasma is supported by a coil 122 internal to the chamber through which AC current is passed. The current couples with the atoms of gas and sputtered material to ionize a significant portion thereof. The chamber 100 includes sidewalls 101, lid 102, and bottom 103. The lid 102 includes a target backing plate 104 which supports a target 105 of the material to be deposited.

The target 105 is preferably made of a conductive material and a doping material. The conductive material is selected from a group of copper, tungsten, aluminum or combinations thereof. The doping material is selected from a group of phosphorus, boron, indium, tin, beryllium or combinations thereof. Preferably, the conductive material is copper and the doping material is phosphorus. The percentage by weight of the doping material is from about 0.01% to about 15%, preferably about 0.01% to about 0.5%. The target can be prepared, for example, by uniformly mixing a phosphorus oxide into a molten copper material where the oxygen is thermally or chemically released and the remaining phosphorus and copper formed into a target. A number of processes known to metallurgists are possible to produce a doped target.

An opening 108 in the chamber 100 provides access for a robot (not shown) to deliver and retrieve substrates 110 to and from the chamber 100. A substrate support 112 supports the substrate 110 in the chamber and is typically grounded. The substrate support 112 is mounted on a lift motor 114 that raises and lowers the substrate support 112 and a substrate 110 disposed thereon. A lift plate 116 connected to a lift motor 118 is mounted in the chamber 100 and raises and lowers pins 120a, 120b mounted in the substrate support 112. The pins 120a, 120b raise and lower the substrate 110 from and to the surface of the substrate support 112. A coil 122 is mounted between the substrate support 112 and the target 105 and provides inductively-coupled magnetic fields in the chamber 100 to assist in generating and maintaining a plasma between the target 105 and substrate 110. The coil 122 is sputtered due to its location between the target and the substrate 110 and preferably is made of similar constituents as the target 105. For instance, the coil 122 could be made of copper and phosphorus. The doping percentage of the coil 122 could vary compared to the target doping percentage depending on the desired layer composition and is empirically determined by varying the relative doping percentages. Power supplied to the coil 122 densifies the plasma which ionizes the sputtered material. The ionized material is then directed toward the substrate 110 and deposited thereon. A shield 124 is disposed in the chamber 100 to shield the chamber sidewalls 101 from the sputtered material. The shield 124 also supports the coil 122 by coil supports 126. The coil supports 126 electrically insulate the coil 122 from the shield 124 and the chamber 100 and can be made of similar material as the coil. The clamp ring 128 is mounted between the coil 122 and the substrate support 112 and shields an outer edge and backside of the substrate from sputtered materials when the substrate 110 is raised into a processing position to engage the lower portion of the clamp ring 128. In some chamber configurations, the shield 124 supports the clamp ring 128 when the substrate 110 is lowered below the shield 124 to enable substrate transfer.

Three power supplies are used in this type of sputtering chamber. A power supply 130 delivers preferably DC power to the target 105 to cause the processing gas to form a plasma, although RF power can be used. Magnets 106a, 106b disposed behind the target backing plate 104 increase the density of electrons adjacent to the target 105, thus increasing ionization at the target to increase the sputtering efficiency. The magnets 106a, 106b generate magnetic field lines generally parallel to the face of the target, around which electrons are trapped in spinning orbits to increase the likelihood of a collision with, and ionization of, a gas atom for sputtering. A power supply 132, preferably a RF power supply, supplies electrical power to the coil 122 to couple with and increase the density of the plasma. Another power supply 134, typically a DC power supply, biases the substrate support 112 with respect to the plasma and provides directional attraction (or repulsion) of the ionized sputtered material toward the substrate 110.

Processing gas, such as an inert gas of argon or helium or a reactive gas such as nitrogen, is supplied to the chamber 100 through a gas inlet 136 from gas sources 138, 140 as metered by respective mass flow controllers 142, 144. A vacuum pump 146 is connected to the chamber 100 at an exhaust port 148 to exhaust the chamber 100 and maintain the desired pressure in the chamber 100.

A controller 149 generally controls the functions of the power supplies, lift motors, mass flow controllers for gas injection, vacuum pump, and other associated chamber components and functions. The controller 149 controls the power supply 130 coupled to the target 105 to cause the processing gas to form a plasma and sputter the target material. The controller 149 also controls the power supply 132 coupled to the coil 122 to increase the density of the plasma and ionize the sputtered material. The controller 149 also controls the power supply 134 to provide directional attraction of the ionized sputtered material to the substrate surface. The controller 149 executes system control software stored in a memory, which in the preferred embodiment is a hard disk drive, and can include analog and digital input/output boards, interface boards, and stepper motor controller boards (not shown). Optical and/or magnetic sensors (not shown) are generally used to move and determine the position of movable mechanical assemblies.

An exemplary process regime for a copper seed layer doped with phosphorus on a 200 mm wafer will now be described. A noble gas, such as helium or argon, is flown into the chamber at a rate sufficient to produce a chamber pressure of about 5 to about 100 mTorr, preferably about 20 mTorr to about 50 mTorr. The power supply 130 delivers about 200 watts (W) to about 6 kW, preferably about 750 W to about 1.5 kW to the target 105. The power supply 132 delivers about 500 W to about 5 kW, preferably about 1.5 kW to about 2.5 kW AC to the coil 122. The power supply 134 delivers about 0 W to about 600 W, preferably about 350 W to about 500 W to the substrate support 112 with a duty cycle between 0% to 100% and preferably about 50% to about 75%. When the substrate temperature is controlled, a surface temperature between about $-50°$ C. to about $150°$ C., preferably below $50°$ C. is useful for processing during the seed layer deposition. The copper/phosphorus material is deposited on the substrate to a thickness of about 500 Å to about 4000 Å, preferably about 2000 Å.

Figure 2:
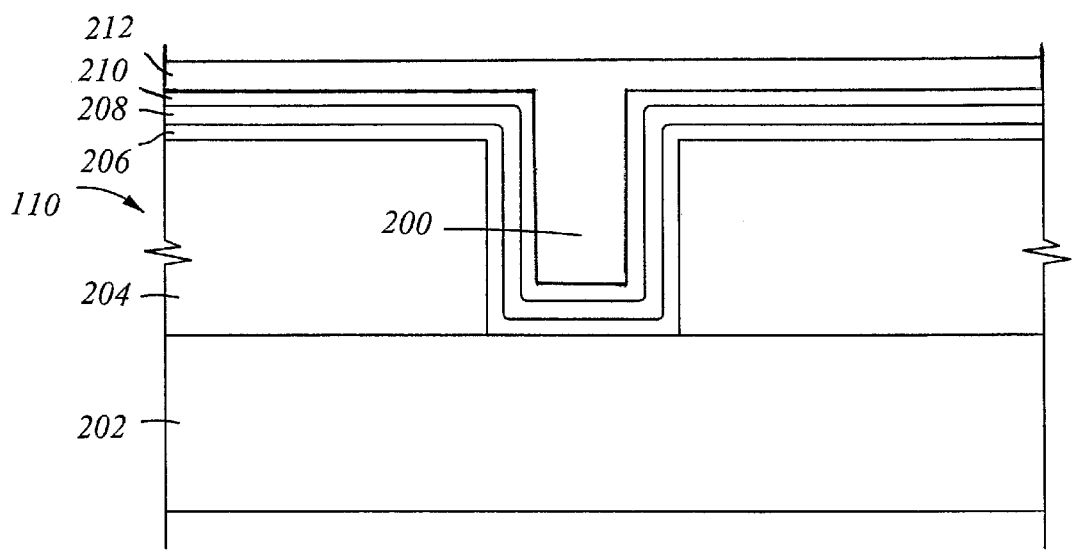
FIG. 2 is a schematic cross-sectional view of a substrate with a seed layer formed on the substrate.

FIG. 2 is a schematic cross-sectional view of an exemplary substrate 110 formed according to a process of the invention. A dielectric layer 204 is deposited on the substrate 110 and etched to form the feature 200, such as a via, contact, trench or line. The term "substrate" is broadly defined as the underlying material and can include a series of underlying layers. The dielectric layer 204 can be a pre-metal dielectric layer deposited over a silicon wafer or an interlevel dielectric layer.

A liner layer 206, such as a Ta layer, is deposited on the dielectric layer 204 as a transition layer to promote adhesion to the underlying material and reduce contact/via resistance. The liner layer 206 is preferably deposited using a IMP PVD process and can be deposited by other PVD processes, such as collimated or long throw sputtering or other methods such as CVD. Collimated sputtering is generally performed by placing a collimator (not shown) between the target and the substrate to filter sputtered material traveling obliquely through the collimator. Long throw sputtering is generally performed by increasing the spacing between the target and the substrate. The increased distance increases the probability that the sputtered material reaching the substrate is directed normal to the substrate surface. A barrier layer 208 of tantalum nitride (TaN) is deposited on the liner layer 206 using PVD, and preferably an IMP PVD process, especially for high aspect ratio features. The barrier layer prevents diffusion of copper into adjacent layers. While Ta/TaN are preferred, other liner and/or barrier layers that can be used are titanium (Ti), titanium nitride (TiN), tungsten (W), tungsten nitride (WN) and other refractory metals and their nitrided counterparts.

A doped seed layer 210 is deposited over the TaN barrier layer 208, using PVD and preferably IMP PVD. The seed layer 210 is deposited by sputtering a conductive target preferably doped with phosphorus. The conductive material is selected from the group of copper, tungsten, aluminum or combinations thereof. The doping material is selected from the group of phosphorus, boron, indium, tin, beryllium or combinations thereof. Preferably, the conductive material is copper and the doping material is phosphorus. The percentage by weight of the doping material is from about 0.01% to about 15%, preferably about 0.01% to about 0.5%. The copper/phosphorus material is deposited over the barrier layer 208 as a seed layer for a subsequent copper layer 212.

The copper layer 212 can be deposited by PVD, IMP, CVD, electroplating, electroless deposition, evaporation, or other known methods. Preferably, copper layer 212 is deposited using electroplating techniques. An exemplary electroplating system is described in co-pending U.S. patent application Ser. No. 09/350,877, filed on Jul. 9, 1999, and in co-pending U.S. patent application Ser. No. 09/289,074, filed on Apr. 8, 1999, and are incorporated herein by reference. A description of an electroplating chemistry, particularly the composition of the electrolyte and additives, is provided in co-pending U.S. patent application Ser. No. 09/245,780, filed on Feb. 5, 1999 and is incorporated herein by reference.

Subsequent processing can include planarization by chemical mechanical polishing (CMP), additional deposition of layers, etching, and other processes known to substrate manufacturing.

The doping material is believed to reduce surface diffusivity of the sputtered conductive material, such as copper, as the sputtered material is deposited. Less agglomeration occurs with the doping and the sputtered conductive layer is deposited more conformally with less voids. For a subsequent process, such as electroplating, that is affected by the integrity of an underlying seed layer, the doped layer yields a more uniform subsequent layer deposited thereon.

Phosphorus and other doping materials also reduce copper oxidation due to their generally greater affinity for oxygen than copper at processing temperatures. It is believed that oxygen reaching the substrate surface prefers initiating bonds with the dopant, leaving the copper less likely to be oxidized. A lower level of oxidation reduces the resistance of both the target material and the deposited layer of the target material. Reduced oxidation also assists in reducing corrosion in post-deposition processing such as wet CMP processing. The phosphorus is also believed to harden the target and the deposited layer. Empirical evidence suggests that harder targets result in reduced arcing between the target and an adjacent structure, where the arcing dislodges unwanted pieces of the target (splats) that are deposited on the substrate and contaminates the deposition. The phosphorus is also believed to lower the melting temperature of the copper, so that surface mobility and planarization can occur at lower temperatures.

Variations in the orientation of the chambers and other system components are possible. Additionally, all movements and positions, such as "above", "top", "below", "under", "bottom", "side", described herein are relative to positions of objects such as the target, substrate, and coil. Accordingly, it is contemplated by the present invention to orient any or all of the components to achieve the desired support of substrates in a processing system.

While foregoing is directed to the preferred embodiment of the present invention, other and further embodiments of the invention may be devised without departing from the basic scope thereof and the scope thereof is determined by the claims that follow.

What is claimed is:

1. A method for forming a conductive feature, comprising:

sputtering material from a target comprising copper and phosphorus;

ionizing the sputtered material;

attracting the sputtered material to the substrate to deposit a seed layer comprising copper and phosphorous; and electroplating copper on the seed layer.

* * * * *